United States Patent [19]

Scifres et al.

[11] 4,277,762
[45] Jul. 7, 1981

[54] MODE CONTROL OF HETEROJUNCTION INJECTION LASERS AND METHOD OF FABRICATION

[75] Inventors: Donald R. Scifres, Los Altos; William Streifer, Palo Alto; Robert D. Burnham, Los Altos Hills, all of Calif.

[73] Assignee: Xerox Corporation, Stamford, Conn.

[21] Appl. No.: 61,539

[22] Filed: Jul. 27, 1979

Related U.S. Application Data

[62] Division of Ser. No. 869,190, Jan. 13, 1978, Pat. No. 4,185,256.

[51] Int. Cl.$^3$ .............................................. H01S 3/19
[52] U.S. Cl. ............................................ 331/94.5 H
[58] Field of Search ...................... 331/94.5 H, 94.5 K

[56] References Cited

U.S. PATENT DOCUMENTS

| | | | |
|---|---|---|---|
| 3,479,614 | 11/1969 | Ashkin | 331/94.5 H |
| 4,190,809 | 2/1980 | Goodman et al. | 331/94.5 H |

Primary Examiner—James W. Davie
Attorney, Agent, or Firm—W. Douglas Carothers, Jr.

[57] ABSTRACT

Mode control both for longitudinal and fundamental transverse modes can be achieved by employing a mesa structure on the laser substrate during fabrication. The mesa will provide significant variations in the thickness of one or more hetrostructure waveguiding layers that may be fabricated on the mesa formed substrate. As a result, the equivalent index of refraction for each waveguiding layer will be different. For longitudinal mode operation, a branching directional coupler can be directly fabricated during preferential LPE growth due to the presence of the mesa formed on the substrate. For fundamental transverse mode operation, oscillation can be restricted to a high gain region in a waveguiding layer due to the presence of the mesa and thickness variation and curvature in the active layer. Connected or juxtaposed stripe contact geometry can also be employed to provide a multicavity effect in a light waveguiding layer to enhance longitudinal mode selectivity.

7 Claims, 14 Drawing Figures

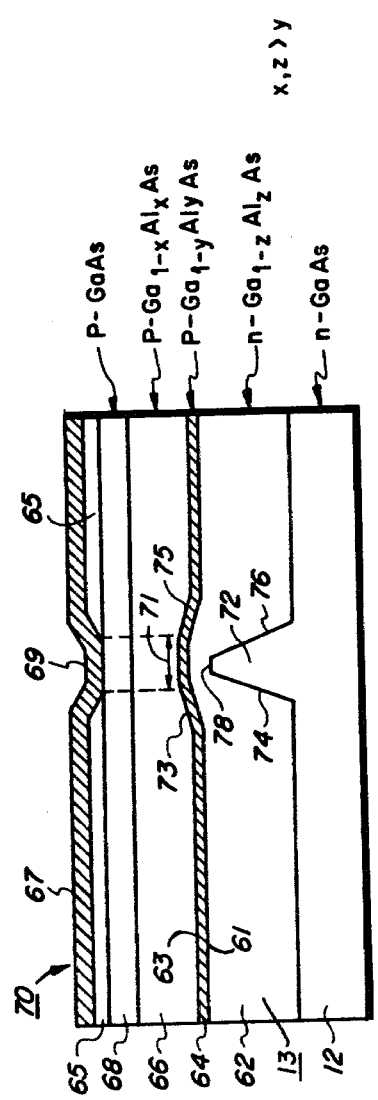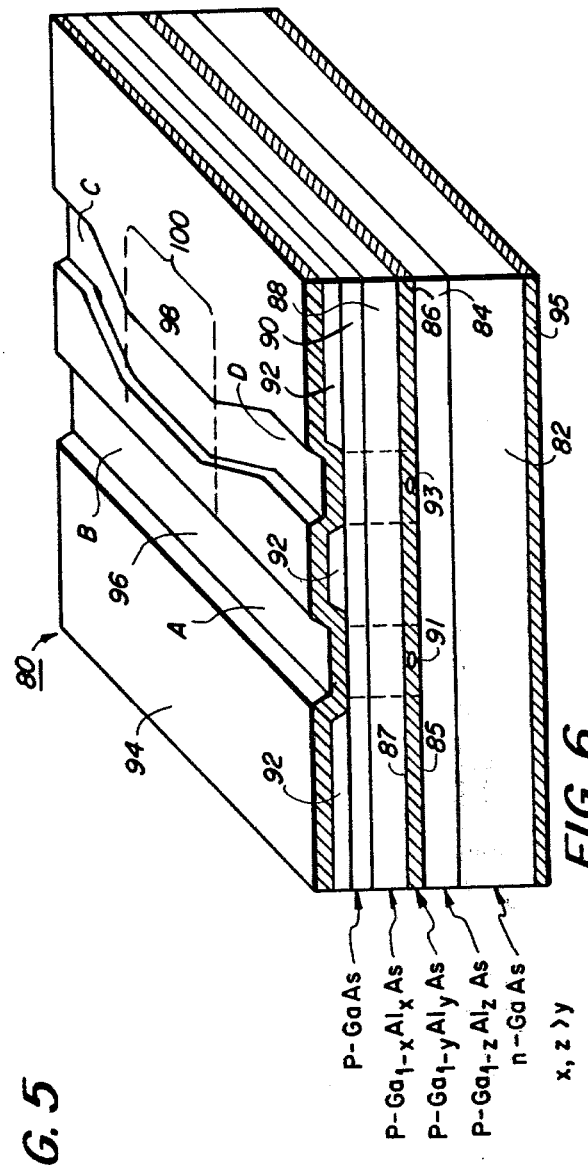

MODE CONTROL OF HETEROJUNCTION INJECTION LASERS AND METHOD OF FABRICATION

This is a division of application Ser. No. 869,190, filed Jan. 13, 1978 U.S. Pat. No. 4,185,256.

BACKGROUND OF THE INVENTION

This invention relates to semiconductor injection lasers and, more particularly, to heterojunction injection lasers adapted for longitudinal mode and fundamental transverse mode operation.

Higher power outputs are being sought in semiconductor junction lasers to meet requirements necessary for optical fiber transmission, optical disc writing and integrated optical components and circuits. To this end, control of single longitudinal mode selectivity and fundamental transverse mode operation have become of increasing interest. For example, development of longitudinal mode selectivity is important in order to provide high bit rate optical fiber communication. Also fundamental transverse mode confinement and control would optimize the standing wave for greater power output useful in optical disc applications.

Also there is need in integrated optical-circuitry to provide efficient light couplers from one waveguiding cavity to another independent waveguiding cavity. The need arises from the fact that in fabricating optical communication chips, light from an outside laser must be efficiently transferred to a waveguide and then transferred out to another light coupled component, such as, another light transmitting cavity or fiber optic transmission line.

In longitudinal mode selectivity, coupled laser cavities of different cavity lengths would provide a multicavity structure so that the combined effect of reflecting light in the two light transmitting cavities would be to enhance the single longitudinal mode operation and provide a higher power output. Such a structure is disclosed in an article entitled "The Bent-Guide Structure Al GaAs-GaAs Semiconductor Laser" by Nobuo Matsumoto in IEEE Journal of Quantum Electronics, Vol. GE-13, No. 8, pages 560–564, August 1977. However, the L-type laser disclosed requires sophisticated fabricating technique including the provision of a smooth and polished finish on the internal bent-guide surface from which the two light guiding cavities of different lengths are defined.

OBJECTS OF THE INVENTION

It is the primary object of this invention to enhance single longitudinal mode and fundamental transverse mode operation in a heterojunction injection laser.

Another object of this invention is to provide for more efficient transfer of light wave energy from one light waveguiding layer or cavity to another.

Another object of this invention is the provision of a branching directional coupler integrated into an injection laser.

A further object of this invention is the provision of transferring a portion of a guided light wave in an active region of the laser into a wider bandgap waveguide, transport to the transferred light wave.

A still further object of this invention is the provision of a mesa on the substrate of an injection laser to improve branch directional coupling and enhance longitudinal mode selectivity.

Still another object of this invention is the provision of a mesa on the substrate of a hetrojunction injection laser to aid in creating a stabilized region in the active layer of the laser for fundamental transverse mode operation.

Another object of this invention is the provision of at least two stripe channel guides on the top surface of an injection laser that are either in juxtaposed position or interconnecting to provide current confinement and optical paths of different length in an active waveguiding layer of the laser.

It is the general object of this invention to provide heterostructure junction laser with improved power output in the longitudinal and transverse modes of operation.

SUMMARY OF THE INVENTION

In accordance with the invention, two coextensive waveguiding layers are provided in a heterojunction injection laser. One of the layers has a lower bandgap than the other layer. Hence the higher bandgap layer is transparent to light generated in the lower bandgap material. The layers are separated by an intermediate layer which has a wider bandgap than the two waveguiding layers. Each of the waveguiding layers have significant variations in cross-sectional thickness along their lengths so that at the closest juxtaposed region of these layers, they have their thinnest cross-sectional extent. The characteristics of these layers in this region form a branch directional coupler between the two waveguiding layers. Thus, two optical paths are coupled for light wave propagation under lasing conditions.

The thin layer region as well as variation in layer thickness is provided during fabrication of the laser. A mesa is formed on the substrate body prior to LPE (liquid phase epitaxy) growth processes of other crystal layers.

For single longitudinal mode operation, upon forward biasing, sustained laser oscillation is obtained in the active layer and evanescent wave coupling is accomplished in the wider bandgap passive layer. As a result, two adjacent light beams in the near infrared region of the spectrum will emerge from the end facets of the laser.

For fundamental transverse mode operation, the passive transparent layer may be eliminated. The presence of the mesa during laser fabrication provides a thin active region in the optical waveguide layer directly above the mesa. This layer during growth also is caused to bend or curve away from this region with an accompanying increase in cross-sectional layer thickness. With proper stripe contact geometry, restricted oscillation in the fundamental transverse mode can be obtained with gain-to-loss region thickness being sufficient in the active region to suppress higher transverse modes.

A mesa formed on the laser substrate may be employed to provide an efficient branching directional coupler requiring no additonal steps in conventional fabrication or additional fabrication components to create a coupling region between two waveguiding layers within an injection laser. The mesa also causes crystal growth thickness of these two waveguiding layers to vary along their length thereby creating two optical paths in the laser having different equivalent indices of refraction. As a result, a multicavity effect is created even though the actual length of these light waveguiding layers may be actually the same. Longitudinal mode selectively is enhanced since at one wavelength the radiation from both optical paths will be in phase and additive.

The variation in crystal growth thicknesses in the vicinity of the mesa can be also be utilized to provide oscillations in the fundamental transverse mode. In this case, the current conducting stripe is fabricated to be in a direction parallel to the length of the mesa.

Branching directional coupling may also be accomplished with the employment of two or more adjacent or interconnecting stripe contacts providing different path of lengths guided light in active waveguiding layer formed within the injection laser. Again, longitudinal mode selectivity will be enhanced since the radiation from the established optical paths will be in phase at a given wavelength providing a higher reflection intensity.

Other objects and attainments together with a fuller understanding of the invention will become apparent and appreciated by referring to the following description and claims taken in conjunction with the accompanying drawings.

BRIEF DESCRIPTION OF THE DRAWINGS

In the Drawings:

FIG. 5 is a front diagrammatic view of a mesa formed in the substrate of an injection laser having an active waveguiding cavity and adapted for transverse mode control.

FIG. 6 is a perspective diagrammatic view of an injection laser with an active waveguiding cavity and having an adjacent stripe configuration for longitudinal mode control.

DESCRIPTION OF THE PREFERRED EMBODIMENTS

Figure 1:
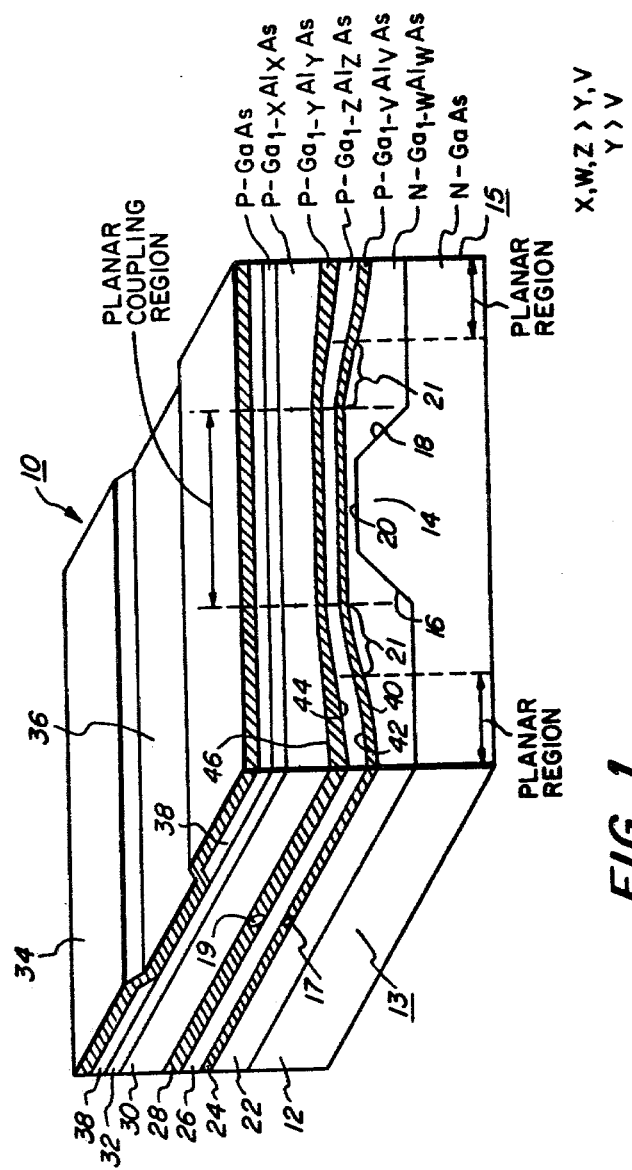
FIG. 1 is a perspective diagrammatic view of a mesa formed injection laser according to the invention adapted for longitudinal mode operation.

Referring to FIG. 1, there is schematically shown a heterojunction injection laser 10 in accordance with an illustrative embodiment of this invention. The laser 10 comprises a substrate body 12 of one conductivity type upon which is formed a mesa 14. The mesa 14 has side walls 16 and 18 and a flat top surface 20. This provides mesa 14 with a trapozoidal shaped cross-sectional configuration. Other geometrical configurations may be utilized for mesa, one of which is illustrated in FIG. 5.

The laser 10 is formed of the following layers in the order recited: a wide bandgap layer 22; narrowest bandgap layer 24, hereinafter also referred to as the active waveguiding layer; another wide bandgap layer 26, a narrower bandgap layer 28, hereinafter also referred to as the passive or transparent layer (meaning transparent to light propagation); a wide bandgap layer 30 and a top contacting layer 32 of the same semiconductor material as the substrate body 12 but of different conductivity type. On top layer 32 is contact layer 34, with stripe 36 being defined by insulating layers 38.

Layers 22–32 are grown by LPE on substrate 1. Insulating layers 38 are produced on layer 32 by photolithographic techniques and may comprise $SiO_2$ or $Si_3N_4$ or other suitable insulating and current confining structure as known in the art. Contact layer is applied by metal deposition and may comprise integral layers of Ti, Pt and Au or integral layers of Cr and Au.

Stripe 36 when connected to a power supply confines the current to flow in a direction normal to mesa 14 and cleaved end facets 13 and 15. As will be explained in detail hereinafter, the output beams will emanate from zones 17 and 19 shown in facet 13 when laser 10 is forward biased.

Layers 22, 24, 26 and 28 are typically of the same semiconductor material GaAlAs. Each have different mole fractions of Al to provide desired bandgap and refractive index properties. Layers 22, 26 and 30 should have the widest bandgap while active layer 24 has the smallest bandgap. Layers 24 and 28 have smaller bandgaps than layers 22, 26 and 30 but layer 24 has a smaller bandgap than layer 28 making it the active layer of laser 10.

The mole fraction constituents of Ga and Al in layers 24 and 28 are not greatly different. Because of this fact, layer 28 is transparent to lasing light induced in layer 24. It is capable of acting as an optical waveguide dictated by the lower refractive index of adjacent boundary layers 26 and 30.

These layers form four heterojunctions 40, 42, 44 and 46 respectively, at layer interfaces. Heterojunction 40 is a p-n heterojunction while heterojunctions 42, 44 and 46 are common conductivity type heterojunctions.

The fabrication of laser 10 is a mixed crystal GaAs-GaAlAs semiconductor. The layers 12 (substrate), 22, 24, 26, 28, 30 and 32 may comprise, respectively, n-GaAs; n-$Ga_{1-w}Al_wAs$; p-$Ga_{1-v}Al_vAs$, p-$Ga_{1-z}Al_zAs$; p-$Ga_{1-y}Al_yAs$, p-$Ga_{1-x}Al_xAs$, and p-GaAs where, x, w z>y, v and, y>v.

For good coupling, although not absolutely necessary, x>w−z.

Also the active layer 24 can be of n-type conductivity rather than p.

As is well recognized in the art, the conductivity type of certain layers may be reversed to produce other similar configurations. In such another configuration layers 12 (substrate) 22, 24, 26, 28, 30 and 32 would, respectively, be n-GaAs; n-$Ga_{1-w}Al_wAs$; n-$Ga_{1v}Al_vAs$; n-$Ga_{1-z}Al_zAs$, p or n-$Ga_{1-y}Al_yAs$, p-$Ga_{1-x}Al_xAs$ and p-GaAs where, x, w, z>y, v and, v>y.

Here, the active layer would be layer 28 and layer 24 would be the passive layer. Active layer 28 may of either p or n-type conductivity. In addition, complimentary structures might be grown on p-type substrates.

Also different crystal materials such as InGaAsP or GaAlAsP might be used.

Laser 10 may be grown by standard liquid phase epitaxy having actual parameters as shown in Table I.

TABLE I

| Layer | Layer Composition | Thickness Above Mesa 14 - In Coupling Region | Typical Thickness In Planar Region |
|---|---|---|---|
| 22 | n-Ga$_{0.6}$Al$_{0.4}$As | 0.60 μm | 2.20 μm |
| 24 | p-Ga$_{0.95}$Al$_{0.05}$As | 0.15 μm | 0.20 μm |
| 26 | p-Ga$_{0.7}$Al$_{0.3}$As | 0.22 μm | 0.95 μm |
| 28 | p-Ga$_{0.7}$Al$_{0.1}$As transparent waveguide | 0.75 μm | 1.00 μm |
| 30 | p-Ga$_{0.6}$Al$_{0.4}$As | 1.50 μm | 2.50 μm |
| 32 | p-GaAs | 0.5 μm | 0.5 μm |

Layers 24, 26 and 28 may be either p or n-type conductivity, as previously, indicated with parameters as shown in Table II.

TABLE II

| Layer | Layer Composition |
|---|---|
| 24 | Ga$_{0.9}$Al$_{.1}$As |
| 26 | Ga$_{.75}$Al$_{.25}$As |
| 28 | Ga$_{.95}$Al$_{.05}$As |

The overall length of laser 10 of FIG. 1 may be 500 μm. The stripe 36 may have a width of approximately 12 μm. The coupling region, to be explained in more detail hereinafter, may be 23 μm long.

Thickness variations throughout the length of layers 24, 26 and 28, in particular, is achieved by the mesa 14 formed on substrate 12 prior to LPE growth. Active layer 24 as well as passive layer 28 and intermediate layer 26 are quite thin in cross-section and planar in the area directly above mesa 14. This area is identified in FIG. 1 as the coupling region. Planar regions are shown as areas on adjacent sides of mesa 14.

The sequential LPE growth of the layers 22–30 proceeds in a manner to sequentially smooth out previously grown layers. Initial layers, such as, layers 22, 24 and 26, have significant thickness variations when comparing their thickness at the coupling region with thickness at the planar regions. However, the growth of contacting layer 32 is quite smooth and substantially planar throughout its length.

In using the term "planar" in identifying planar regions in FIG. 1, it is not meant that layers 22–30 are absolutely flat planes. Rather, they are to identify these regions as being significantly more flat in nature as compared to those areas in these layers between the ends of the coupling region, which is planar, and the beginning of the planar regions. In those areas, at 21 in FIG. 1, these layers possess substantial curvature due to the presence of the mesa 14 during layer growth.

The length of the coupling region is governed by the angle of the faces 18 and 16 as well as the height of the mesa 14 and the width of its top surface 20. Typically the top surface or edge of the mesa may be typically 5 to 10 μm wide but could be in a range of 1 to 30 μm. Height may be typically 3 μm to 5 μm, but could be in a range of 1 to 20 μm in depth. Also, the mesa could even have a triangular cross-sectional configuration. The main effect to be achieved is the growth of thin layers above the mesa for a desired coupling length to provide a branching directional coupler between active layer 24 and passive layer 28. As the width of the top surface 20 of the mesa 14 is made more narrower relative to the depth or height of the mesa, the more narrower is the length of the flat or planar thin layer region directly above the mesa.

Fabrication of injection laser 10 may proceed as follows. First, the (100) oriented n-GaAs substrate 12 is masked with 12 μm width stripes of photoresist oriented parallel to the (0$\bar{1}$1) direction. Then an etchant is applied to the substrate surface. The etched mesa 14 should preferably have a rather narrow top surface (about 5 μm wide) and deep side walls 16 and 18 (about 5 μm deep) to provide significant layer thickness variation between the coupling region and the planar regions. Following etching, the substrate 12 is cleaned and placed in a conventional LPE furnace. Layers 22 through 32 are then grown with growth times adjusted to provide layer thickness shown, for example, in Table I. The growth time of layer 22 is adjusted so that it is sufficiently thin above mesa 14 to provide high coupling while being thick enough in the planar regions to eliminate radiation and absorption losses in substrate 12. Although the laser 10 has been discussed as being fabricated by liquid phase epitaxy, molecular beam epitaxy or vapor phase epitaxy could also be used with various masking techniques.

When the p-n junction 40 is forward biased (for example, a pulsed threshold current of approximately 2.2 KA/cm$^2$), the laser will lase with light generated in the active waveguide layer 24. In the coupling region directly above mesa 14, light is continuously coupled from the active waveguiding layer 24 in the coupling region into the transparent passive waveguiding layer 28. This coupling is possible because these layer thicknesses are very small and close together in the flat coupling region while the separation of these layers is much greater in the planar regions. As these layers are made thinner, and in particular, layer 26, coupling between active layer 24 and passive layer 28 becomes stronger because more of the evanescent field of the light wave overlaps from one layer to the other. As shown in Table I, layer 26 has a thickness above mesa 14 of only 0.22 μm, while outside the coupling region and in the planar region, the thickness is 0.95 μm.

Light may propagate down several different optical paths in layers 24 and 28. With reference to FIG. 1 and the region above mesa 14, the optical paths may be active waveguiding layer 24 by itself, or the left hand portion of layer 24 and the right hand portion of layer 28, or the left hand portion of layer 28 and the right hand portion of layer 24. Light will emanate from zones 17 and 19. Passive layer 28 will not likely be an optical path by itself because it is a loss region compared to the gain of layer 24.

The mesa may be positioned centrally with respect to the cleaved laser facets or may be displaced from the center. If the mesa is centrally positioned, several sets of longitudinal modes may be observed. If the mesa is displaced from the center relative to the end facets 13 and 15, two sets of longitudinal modes may be observed as depicted in FIG. 2c.

Figure 2A:
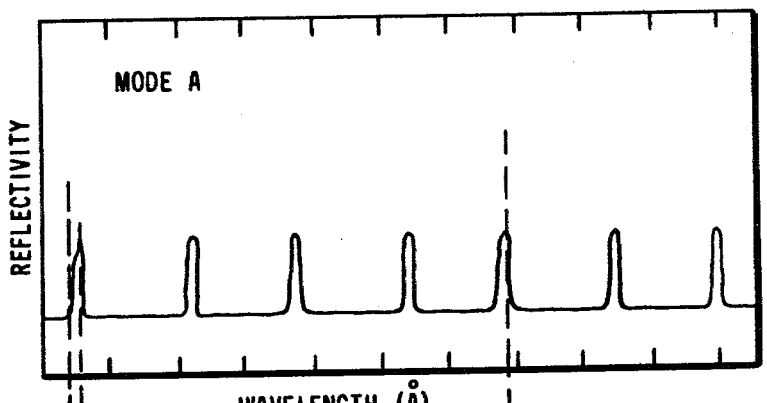
FIG. 2a is a graphic illustration of the longitudinal reflective spectrum of the passive waveguiding cavity of the laser of FIG. 1 without the influence of the active waveguiding cavity.
Figure 2B:
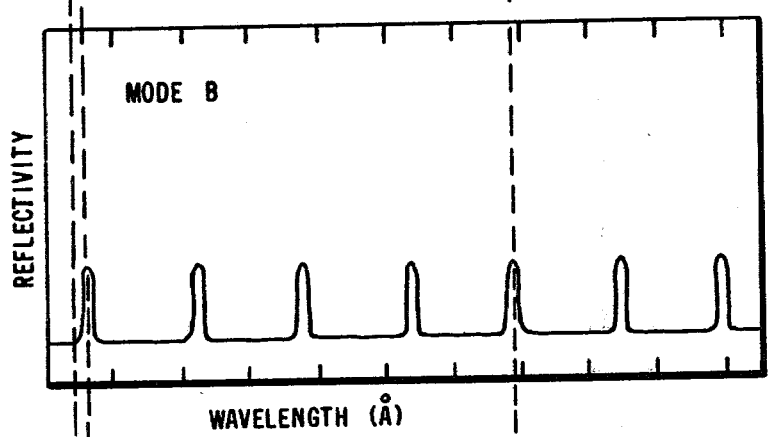
FIG. 2b is a graphic illustration of the longitudinal reflective spectrum of the active waveguiding cavity of the laser of FIG. 1 without the influence of the passive waveguiding cavity.

In FIG. 2a, there is illustrated what the longitudinal reflective spectrum would be for layer 28 assuming no influence from the active layer 24. This is identified as Mode A. FIG. 2b illustrates the longitudinal reflective spectrum of the active waveguide layer 24, assuming no influence from the passive layer 28. This is identified as Mode B. The resultant longitudinal mode spectrum is shown in FIG. 2c. The "chirping" effect between the two sets of longitudinal modes A and B is noted in FIG. 2c. Most of the laser power is concentrated in a single longitudinal mode.

Light propagation down the different optical paths possible in waveguide layers 24 and 28 experiences a different equivalent refractive index in each layer. Layers 24 and 28 each have a different propagation constant. As a result each waveguide layer or combination thereof represents a different optical path length to the propagating light between the cleaved end facets 13 and 15. The interference in the coupling region causes mode selectivity similar in effect to a three mirror laser cavity except that laser 10 requires only two end mirrors.

Figure 2C:
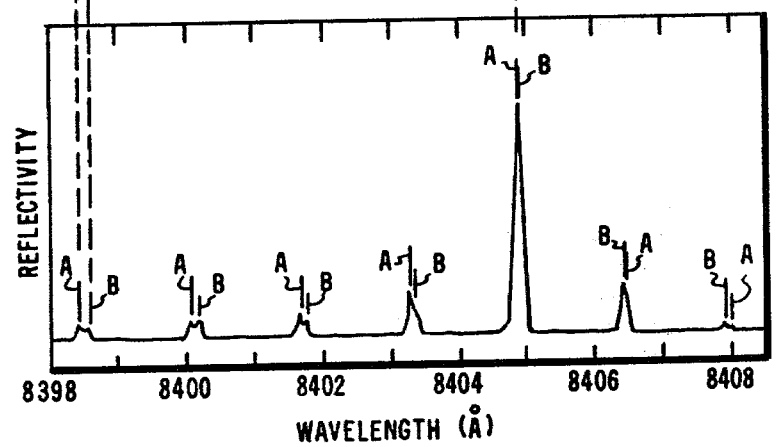
FIG. 2c is a graphic illustration of the combined longitudinal mode spectrum as influenced by the active and passive waveguide coupling of the laser of FIG. 1.

As shown in FIG. 2c, the two sets of longitudinal modes A and B constructively interfere at the dominant longitudinal mode. For mode A, the spacing is 1.588 angstroms while for mode B it is 1.562 angstroms. The constructive interference occurs at approximately 95 angstrom intervals.

The equivalent index in the coupling region of the active layer should be roughly equal to that of the passive layer 28 in the same region. This provides for maximum coupling efficiency. However, these layers need not have the identical equivalent index in the planar regions. In these regions, the equivalent index varies with the variations in layer thicknesses.

In summary, longitudinal mode selectively is enhanced because the equivalent index in two different optical paths formed in layers 24 and 28 is changing thereby providing a new resonance in each light path with the result that the reflection intensities coincide at a given wavelength, as illustrated in FIG. 2c. This is, at one point the wavelengths of laser light from both optical paths will be in phase and will be additive.

The change in equivalent refractive index in each optical path is equivalent to a change in cavity length, although the actual physical length of these paths is virtually the same.

As to probable optical paths of light propagation, where the mesa is displaced from the center of the laser length, we believe that the paths would be more likely (a) a path which includes the longer length in active layer 24 and the shorter length in passive layer 28 and (b) a path which includes only layer 24, since it entirely consists of a gain region.

It should be noted that more than a single mesa 14 can be employed on the surface of substrate 12. Several mesas can be employed on substrate 12 being spaced at 20 to 100 μm intervals. This is illustrated in FIG. 12. These mesas would provide a series of coupling regions and increase boundary conditions resulting in greater intensities at resonance. Distributive feedback can be obtained if the mesa spacing is sufficiently close, that is, if the spacing between the mesas is an integer multiple of one half wavelengths of the developed light.

Figure 3:
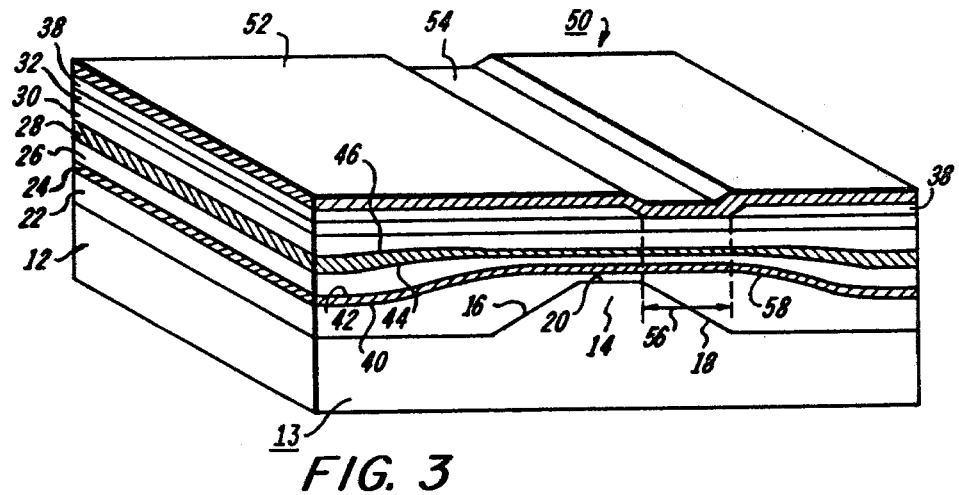
FIG. 3 is a perspective diagrammatic view of a mesa formed injection laser of FIG. 1 adapted for transverse mode control.

The structure of laser 50 in FIG. 3 is the same as that of FIG. 1 except that the stripe contact is positioned for transverse mode operation. Like elements of both figures, therefore, carry the same reference numerals.

In laser 50 of FIG. 3, the stripe layer 52 has a stripe 54 which is positioned parallel to mesa 14 and displaced to one side thereof. With this stripe configuration, fundamental transverse mode operation may be achieved in region 56 of layer 24.

Transverse waveguiding in region 56 is stabilized because on one side of this region there is a bend or curvature 58 in layer 24 and the propagating wave in the transverse mode sees a change in refractive index. Also, a variation in thickness may contribute to the refraction index change. On the other side of region 56, layer 24, is close enough to mesa 14 to induce an extra absorption and radiation loss into substrate 12. Light is also coupled into passive layer 28, as there is a transfer of the evanescent portion of the lasing light in layer 24 into that layer.

FIG. 3a shows the employment of the device in FIG. 3 with multiple mesas on the substrate 12.

Figure 4:
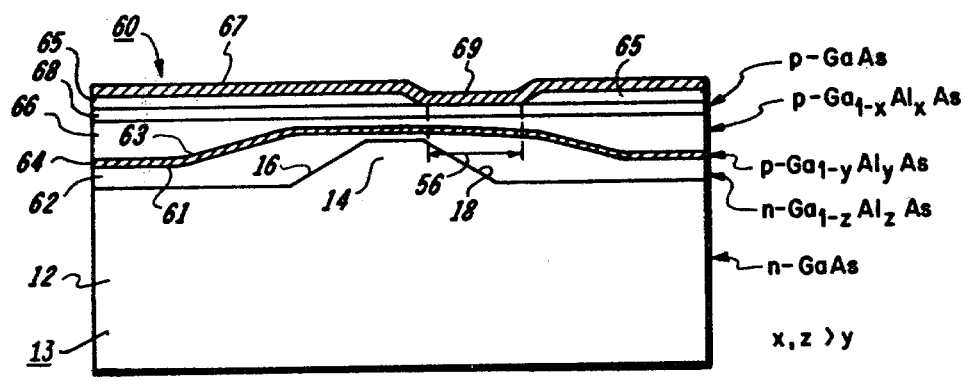
FIG. 4 is a front diagrammatic view of a mesa formed injection laser with an active waveguiding cavity and adapted for transverse mode control.

In FIG. 4, heterojunction laser 60 does not include a passive layer. Only one single waveguiding layer is utilized. The substrate body and mesa structures are the same as previous figures. These GaAlAs layers are LPE grown on the mesa substrate. The mole fraction for Al in boundary layers 62 and 66 is greater than active layer 64 so that layer 64 has the lowest bandgap with the highest refractive index of the three layers. Examples of parameters for layers 62, 64 and 66 respectively, may be the same as layers 22, 24, 30 in Table I. These layers form heterojunctions 61 and 63. The layers may have the constituents and conductivity types as illustrated in FIG. 4 or their complement.

Upper contacting layer 68 is insulated from the contact layer 67 by insulating layers 65 except for stripe 69. Other means well known in the art may be used to form stripe 69. Stripe contact 69 is parallel to mesa 14 and displaced to one side thereof.

Again transverse waveguiding in region 56 is achieved in the same way as FIG. 3. The operation is stabilized by the curvature in the active layer 64 and the absorption and radiation losses into the substrate mesa 14.

The laser 70 in FIG. 5 is actually the same as laser 60 in FIG. 4 except for the thickness of layer 62 directly above the mesa 72. Therefore, like elements have been identified with the same reference numberals.

Mesa 72 is provided in the form of an elongated extension from the surface of substrate 12 and has a trapezoid cross-sectional configuration. Mesa 72 has steep sides 74 and 76 forming a narrow top surface or edge 78.

Because of the narrow shape of mesa 72, a very narrow flat planar active region 71 is created above the mesa. Stripe contact 69 may be positioned directly above region 71 and mesa 72. Fundamental transverse mode operation can be stabilized in this region as bounded by curvatures 73 and 75 in active layer 64, which also change in layer thickness, providing refractive index changes. In this structure, boundary layer 62 between top surface 78 and active layer 64 must be thick enough to avoid absorption losses into substrate 12. Of course, this is controlled by LPE growth of layer 62.

Another manner on achieving longitudinal mode selectivity is to employ two or more stripe contacts which are interconnected or close enough in one region to provide branching directional coupling in an active waveguiding layer of a laser. Laser and stripe contact configuration to achieve this aim are illustrated in FIGS. 6 and 7.

In FIG. 6, heterojunction laser 80 comprises a substrate 82 of one conductivity type followed by the following LPE formed layers: boundary layer 84 of the same conductivity type as substrate 82, active layer 86 of opposite conductivity type, boundary layer 88 of the same conductivity type as active layer 86, contacting layer 90 of the same semiconductor material as substrate 82 but of opposite conductivity type. Layers 84, 86 and 88 form heterojunctions 85 and 87. Insulating layers 92 are formed to provide two stripes 96 and 98 upon deposition of metallic contact layer 94. Besides metal vapor deposition, other stripe formation methods may be used to form the stripe contacts of both FIGS. 6 and 7, such as, selective implantation, selective diffusion or selective chemical etching as is known in the art.

A contact layer 95, comprising, for example, layers of Sn-Au, may also be provided on substrate 82. Stripe 96 is straight while stripe 98 is curved to provide a region 100 wherein the stripe 98 is in closer relation to stripe 96. This double stripe contact geometry provides two restricted paths or guided radiation in active layer 86 producing two output beams shown at zones 91 and 93. As in the case of FIG. 1, longitudinal mode selectivity is enhanced because the different geometry of the two stripes 96 and 98 provides two optical paths of different lengths for radiation oscillations with branching directional coupling provided in active layer 86 below region 100. With optical paths of different lengths, a different resonance is established in each optical path with the result that reflection intensities coincide at a given wavelength as previously discussed in connection with FIG. 2c.

There are possibly four optical paths established in active layer 86. These are represented by the letters A, B, C and D in FIG. 6 indicating half portions of each stripe 96 and 98. The four possible optical path combinations are A, B; A, C; B, D; and C, D.

Figure 7D:
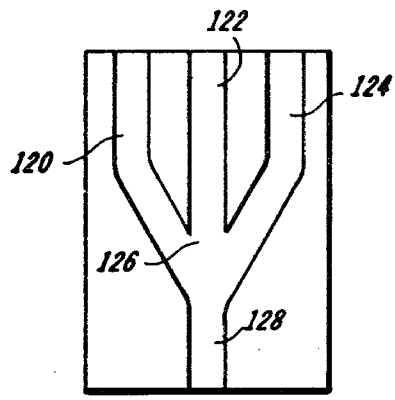
FIGS. 7a–7f are diagrammatic plan views of other stripe configurations that may be employed with the injection laser of FIG. 6.

With stripe contact geometry determining optical path lengths within the active layer 86, many different stripe configurations can be envisioned. Some of these configurations are shown in FIG. 7. FIGS. 7a and 7b illustrate other examples of juxtaposed stripe geometry of the type shown in FIG. 6. FIGS. 7c, 7d, 7e and 7f illustrate connecting stripe geometry.

In FIG. 7a, stripes 102 and 104 would provide different optical path lengths in the laser active layer with a coupling region established in that layer by close proximity of these stripes in region 104. In FIG. 7b, stripes 108 and 110 provide different optical path lengths with coupling established by close proximity of stripes in region 112. However, stripe 108 has a larger width than stripe 110. The difference in stripe width would provide a different equivalent refractive index in the optical path established by the wider geometry of stripe 108. Thus, the cumulative effect of different path lengths and equivalent refractive index would establish different resonant cavities to enhance longitudinal mode selectivity.

Figure 7C:
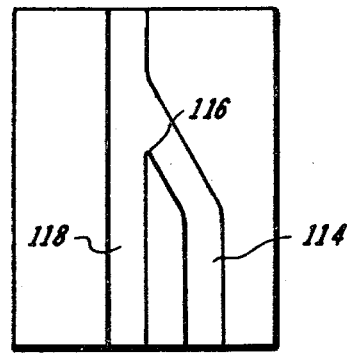
Figure 7A:
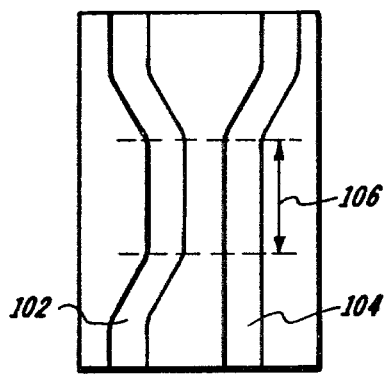

In FIG. 7c, branch stripe portion 114 intersects at 116 with branch stripe portion 118 forming a bifurcated stripe configuration. Two different optical paths may be established in the active layer of the laser, each path sharing together a path portion. In FIGS. 7d and 7e, three branches intersect together that will form three optical paths in the active layer of the laser. In FIG. 7d the branch stripe portions 120, 122 and 124 connect at the same point 126 to share stripe portion 128. In FIG. 7e, branch stripe portions 130, 132 and 134 connecting at different points 136 and 138, respectively, to share stripe portion 140.

Figure 7F:
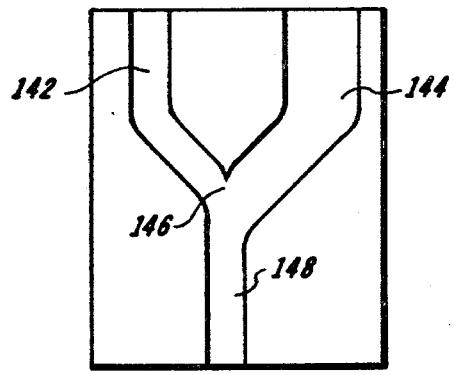
Figure 7E:
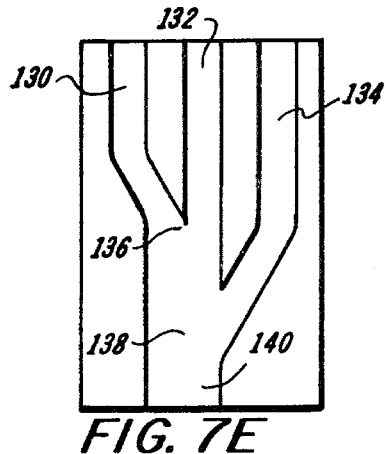
Figure 7B:
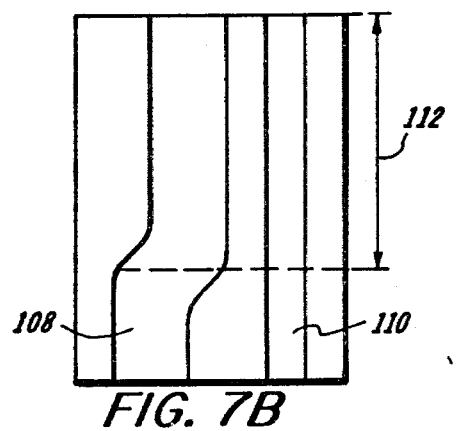

In FIG. 7f, bifurcated stripe portions 142 and 144 connect at point 146 to share stripe portion 148. This stripe configuration is quite similar to FIG. 7c except that branch stripe portion 144 has a wider width than branch stripe portion 142. Thus, stripe portion 144 will function in the same manner as previously explained in connection with wider stripe 108 of FIG. 7b.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In a heterostructure injection laser including a semiconductor body having a light emitting active layer, at least two adjacently disposed elongated current confinement means associated with the upper surface of said body and extending the length thereof to form two current confinement channels in said active layer producing at least two optical paths for light wave propagation under lasing conditions, said current confinement means being sufficiently close to one another in one region of their length so that exponentially decaying light from one optical path can extend and couple into the other optical path, one of said current confinement means is substantially linear for the length of said body and the other said current confinement means is at least partly curved for a portion of the length of said body to form said one region along their optical paths.

2. The laser of claim 1 wherein both of said current confinement means are curved and have at least one portion thereof sufficiently close to each other to provide exponentially decaying light coupling in said optical paths.

3. The laser of claim 1, wherein one of said current confinement means is of greater width along its length than the other of said current confinement means.

4. In a heterostructure injection laser including a semiconductor body having a light emitting active layer, at least two adjacently disposed elongated current confinement means associated with the upper surface of said body and extending the length thereof to form two current confinement channels in said active layer producing at least two optical paths for light wave propagation under lasing conditions, said current confinement means being sufficiently close to one another in one region of their length so that exponentially decaying light from one optical path can extend and couple into the other optical path, said current confinement means are interconnected.

5. The laser of claim 4, wherein said current confinement means are interconnected to form a single section for one portion thereof and branching bifurcated section for the remaining portion there.

6. The laser of claim 5, wherein one of the branching sections of said bifurcated section is of wider width than the other branching section of said bifurcated section.

7. The laser of claim 5, wherein at least three branching sections are provided in said remaining portions, each of said branching sections extending from said one portion at different points along the length thereof.

* * * * *